US012702005B2

(12) United States Patent
Chen et al.

(10) Patent No.: US 12,702,005 B2
(45) Date of Patent: Aug. 4, 2026

(54) SEMICONDUCTOR PACKAGE WITH VAPOR CHAMBER LID

(71) Applicant: MEDIATEK INC., Hsin-Chu (TW)

(72) Inventors: Chin-Lai Chen, Hsinchu City (TW);
Wei-Che Huang, Hsinchu City (TW);
Wen-Sung Hsu, Hsinchu City (TW);
Chun-Yin Lin, Hsinchu City (TW);
Li-Song Lin, Hsinchu City (TW);
Tai-Yu Chen, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 464 days.

(21) Appl. No.: 18/116,258

(22) Filed: Mar. 1, 2023

(65) Prior Publication Data

US 2023/0307316 A1     Sep. 28, 2023

Related U.S. Application Data

(60) Provisional application No. 63/324,210, filed on Mar. 28, 2022.

(51) Int. Cl.
*H10W 40/73*     (2026.01)
*H10W 74/00*     (2026.01)
*H10W 76/40*     (2026.01)
*H10W 90/00*     (2026.01)

(52) U.S. Cl.
CPC ........... *H10W 40/73* (2026.01); *H10W 76/40* (2026.01); *H10W 90/00* (2026.01); *H10W 74/00* (2026.01); *H10W 90/724* (2026.01); *H10W 90/736* (2026.01)

(58) Field of Classification Search
CPC . H01L 2224/16225; H01L 2224/32245; H01L 23/16; H01L 23/427; H01L 23/562; H01L 24/16; H01L 24/32; H01L 25/0655; H01L 2924/182; F28D 15/04
See application file for complete search history.

(56) References Cited

U.S. PATENT DOCUMENTS

| | | | |
|---|---|---|---|
| 2005/0280162 A1* | 12/2005 | Mok ..................... | H10W 72/30 257/E23.088 |
| 2006/0219391 A1 | 10/2006 | Hong | |
| 2009/0056917 A1 | 3/2009 | Majumdar | |
| 2009/0283902 A1 | 11/2009 | Bezama | |
| 2019/0014688 A1 | 1/2019 | Weibel | |
| 2019/0039883 A1 | 2/2019 | Chen | |
| 2019/0348345 A1 | 11/2019 | Parida | |

(Continued)

FOREIGN PATENT DOCUMENTS

| | | |
|---|---|---|
| CN | 110828404 A | 2/2020 |
| CN | 111473671 A | 7/2020 |

(Continued)

*Primary Examiner* — Edward Chin
(74) *Attorney, Agent, or Firm* — Winston Hsu

(57) ABSTRACT

A semiconductor package includes a substrate having a top surface and a bottom surface. A semiconductor device is mounted on the top surface of the substrate. The semiconductor device has an active front surface directly facing the substrate, and an opposite rear surface. A vapor chamber lid is in thermal contact with the rear surface of the semiconductor device. The vapor chamber lid includes an internal vacuum-sealed cavity that stores a working fluid, and wick structures for recirculating the working fluid within the internal vacuum-sealed cavity.

8 Claims, 3 Drawing Sheets

(56) References Cited

U.S. PATENT DOCUMENTS

| | | | |
|---|---|---|---|
| 2021/0041182 A1 | 2/2021 | Eid | |
| 2021/0233833 A1* | 7/2021 | Ku | ........................ H10W 40/73 |
| 2021/0372709 A1* | 12/2021 | Bandyopadhyay | ..... F28D 15/04 |

FOREIGN PATENT DOCUMENTS

| | | | |
|---|---|---|---|
| CN | 111780603 A | 10/2020 |
| CN | 212458063 U | 2/2021 |
| JP | 2015-10765 A | 1/2015 |

* cited by examiner

SEMICONDUCTOR PACKAGE WITH VAPOR CHAMBER LID

CROSS REFERENCE TO RELATED APPLICATIONS

This application claims the benefit of U.S. Provisional Application No. 63/324,210, filed on Mar. 28, 2022. The content of the application is incorporated herein by reference.

BACKGROUND

The present disclosure relates to the field of semiconductor technology. More particularly, the present disclosure relates to a semiconductor package with a vapor chamber lid capable of increasing heat spreading capability and thermal performance.

For high-performance computing (HPC) applications, high-performance flip-chip ball grid array (HFCBGA) is a common package type, which has the advantage of high reliability and low package stress. As the process node progresses, the die size becomes smaller, which brings in the thermal problem like high power density or local hot spot issues.

Modern processors and other active components generate high degrees of heat, and traditional cooling methods can no longer keep operating temperatures sufficiently low. Therefore, there is a need in this industry to provide a more effective cooling solution for the semiconductor packages.

SUMMARY

One object of the present invention is to provide a semiconductor package with a vapor chamber lid capable of spreading heat from sources that generate large total heat loads and/or high-power-density hotspots.

One aspect of the invention provides a semiconductor package including a substrate having a top surface and a bottom surface; a semiconductor device mounted on the top surface of the substrate, the semiconductor device having an active front surface directly facing the substrate, and an opposite rear surface; and a vapor chamber lid in thermal contact with the rear surface of the semiconductor device. The vapor chamber lid comprises an internal vacuum-sealed cavity that stores a working fluid, and wick structures for recirculating the working fluid within the internal vacuum-sealed cavity.

According to some embodiments, the wick structures are porous wick structures that generate a capillary pressure to recirculate the working fluid between an evaporator side and a condenser side of the vapor chamber lid.

According to some embodiments, the semiconductor package further includes a stiffener ring mounted on the top surface of the substrate, wherein the stiffener ring surrounds the semiconductor device.

According to some embodiments, the vapor chamber lid is adhered to the stiffener ring.

According to some embodiments, the semiconductor package further includes a heat sink mounted on the vapor chamber lid and in thermal contact with the condenser side of the vapor chamber lid.

According to some embodiments, the vapor chamber lid comprises copper or aluminum.

According to some embodiments, the working fluid comprises water.

According to some embodiments, the wick structures comprise porous copper wicks.

According to some embodiments, the semiconductor device is adjoined to the top surface of the substrate using a plurality of connecting elements.

According to some embodiments, the semiconductor device comprises a semiconductor die or a semiconductor package, and wherein the substrate comprises a package substrate.

Another aspect of the invention provides a semiconductor package including a substrate having a top surface and a bottom surface; a plurality of semiconductor devices mounted on the top surface of the substrate, wherein each of the plurality of semiconductor devices has an active front surface directly facing the substrate, and an opposite rear surface; and a vapor chamber lid in thermal contact with a rear surface of each of the plurality of semiconductor devices. The vapor chamber lid comprises an internal vacuum-sealed cavity that stores a working fluid, and wick structures for recirculating the working fluid within the internal vacuum-sealed cavity. The wick structures have a differing distribution density across the internal vacuum-sealed cavity to adapt to a power map of the plurality of semiconductor devices.

According to some embodiments, the wick structures are porous wick structures that generate a capillary pressure to recirculate the working fluid between an evaporator side and a condenser side of the vapor chamber lid.

According to some embodiments, the semiconductor package further includes a stiffener ring mounted on the top surface of the substrate, wherein the stiffener ring surrounds the semiconductor device.

According to some embodiments, the vapor chamber lid is adhered to the stiffener ring.

According to some embodiments, the semiconductor package further includes a heat sink mounted on the vapor chamber lid and in thermal contact with the condenser side of the vapor chamber lid.

According to some embodiments, the vapor chamber lid comprises copper or aluminum.

According to some embodiments, the working fluid comprises water.

According to some embodiments, the wick structures comprise porous copper wicks.

According to some embodiments, the semiconductor device is adjoined to the top surface of the substrate using a plurality of connecting elements.

According to some embodiments, the wick structures have a lower density in a region directly over the plurality of semiconductor devices and a higher density in a region far away from the plurality of semiconductor devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

An IC die is typically mounted in a package that is attached to a printed circuit board (PCB). One such type of IC die package is a flip chip package. Flip chip is a technology in which electrically conductive elements, such as solder bumps, connect the IC die or the IC die package to a substrate or a PCB. The IC die is flipped over, so that the solder bumps are aligned with corresponding connection sites on the substrate. The solder bumps are reflow soldered to the corresponding connection sites. A flip chip IC die has pads on the active surface of the die, rather than the peripheral bond pads generally associated with a wirebond IC die. The pads on the active face of the flip chip IC die can connect to input/output (I/O), power, or ground.

A heat spreader may be attached to the non-active surface of the flip chip IC die to facilitate dissipation of heat from the flip chip IC die. The heat spreader can be adhered to the non-active surface of the flip chip IC die using a thermally conductive adhesive, for example. Such heat spreaders rely on dissipation of heat into the ambient air. Current thermal management strategies may rely on spreading high local heat fluxes by conduction in the package lid, ultimately dissipating the total heat load using a mounted heat sink. However, the thermal resistance of the thermal path from the flip chip IC die to the heat sink is often high enough that it becomes the limiting factor for power dissipation. The present invention addresses this issue.

Figure 1:
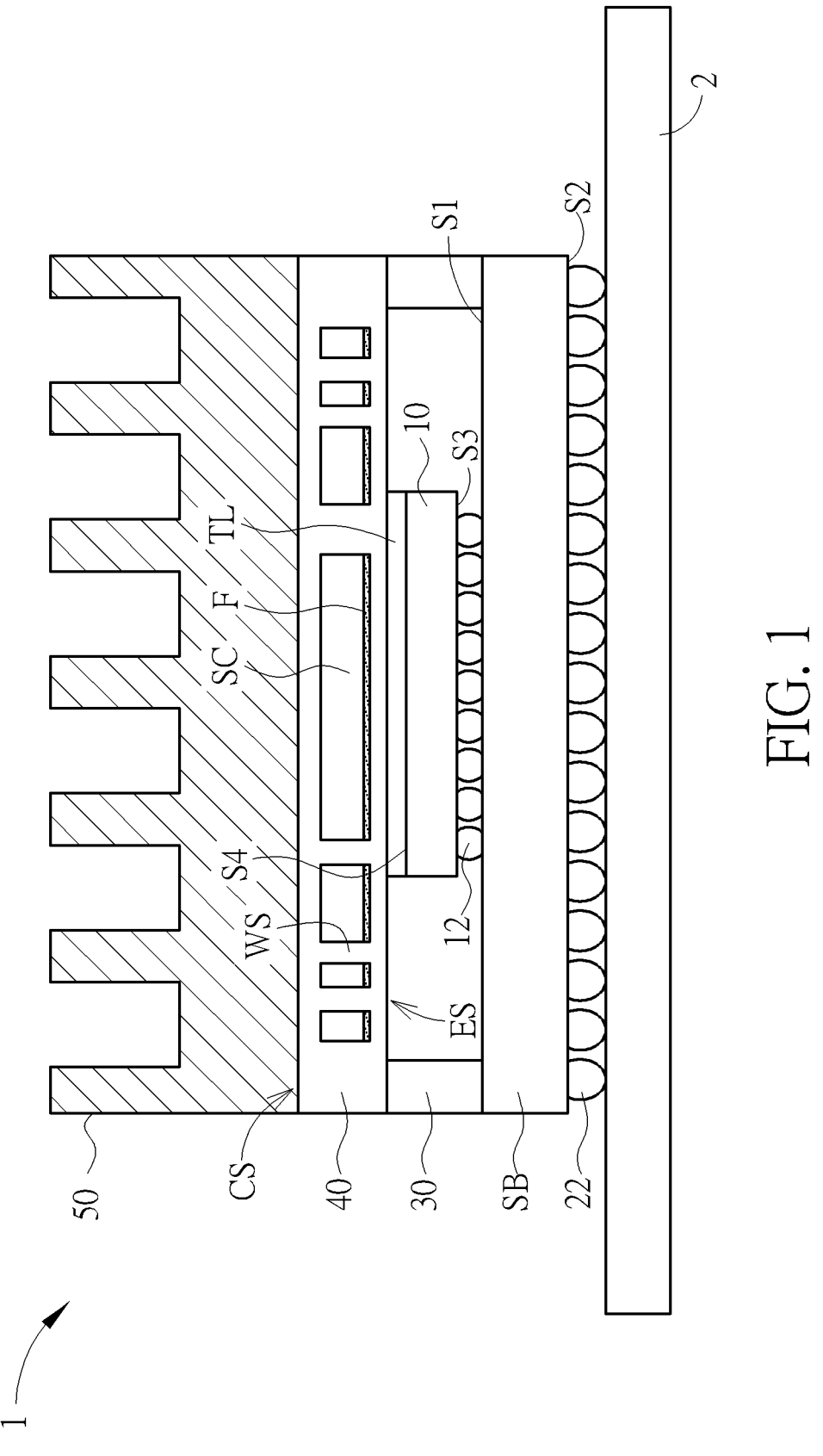
FIG. 1 is a cross-sectional, schematic diagram showing a semiconductor package with a vapor chamber lid according to one embodiment.

FIG. 1 is a cross-sectional, schematic diagram showing a semiconductor package 1 with a vapor chamber lid 40 according to one embodiment. As shown in FIG. 1, the semiconductor package 1 comprises a substrate SB such as a package substrate having a top surface S1 and a bottom surface S2. At least a semiconductor device 10 is mounted on the top surface S1 of the substrate SB in a flip-chip manner. The semiconductor device 10 has an active front surface S3 directly facing the substrate SB, and an opposite rear surface S4. According to an exemplary embodiment, the semiconductor device 10 may comprise a semiconductor die or a semiconductor package, but is not limited thereto. The semiconductor package may comprise one die or multiple die, which may be packaged by using different package types including, but not limited to, flip-chip, wire bonding, or fan-out package.

According to an exemplary embodiment, the semiconductor device 10 may be adjoined to the top surface S1 of the substrate SB using a plurality of connecting elements 12, for example, solder bumps, metal bumps, metal pillars, or micro-bumps. According to an exemplary embodiment, the semiconductor package 1 may be mounted onto a printed circuit board (PCB) 2 through a plurality of solder balls or BGA balls 22 distributed on the bottom surface S2 of the substrate SB.

According to an exemplary embodiment, a stiffener ring 30 is mounted on the top surface S1 of the substrate SB. The stiffener ring 30 surrounds the semiconductor device 10. According to an exemplary embodiment, the stiffener ring 30 may be secured to the top surface S1 of the substrate SB by using an adhesive layer (not shown), but is not limited thereto. The stiffener ring 30 may be disposed along the perimeter of the substrate SB so as to form a rectangular shape when viewed from the above, for example. The stiffener ring 30 may be composed of copper, but is not limited thereto.

According to an exemplary embodiment, a vapor chamber lid 40 is adhered to the stiffener ring 30 by using, for example, an adhesive layer (not shown), but is not limited thereto. According to an exemplary embodiment, the vapor chamber lid 40 is in thermal contact with the rear surface S4 of the semiconductor device 10. According to an exemplary embodiment, for example, a layer of thermal interface material or thermal conductive glue TL may be disposed between the vapor chamber lid 40 and the rear surface S4 of the semiconductor device 10.

According to an exemplary embodiment, the vapor chamber lid 40 comprises an internal vacuum-sealed cavity SC that stores a working fluid F, and wick structures WS for recirculating the working fluid F within the internal vacuum-sealed cavity SC. According to an exemplary embodiment, for example, the vapor chamber lid 40 may be formed of copper or aluminum, but is not limited thereto. According to an exemplary embodiment, for example, the working fluid F may comprise water or deionized water under partial vacuum.

Figure 2:
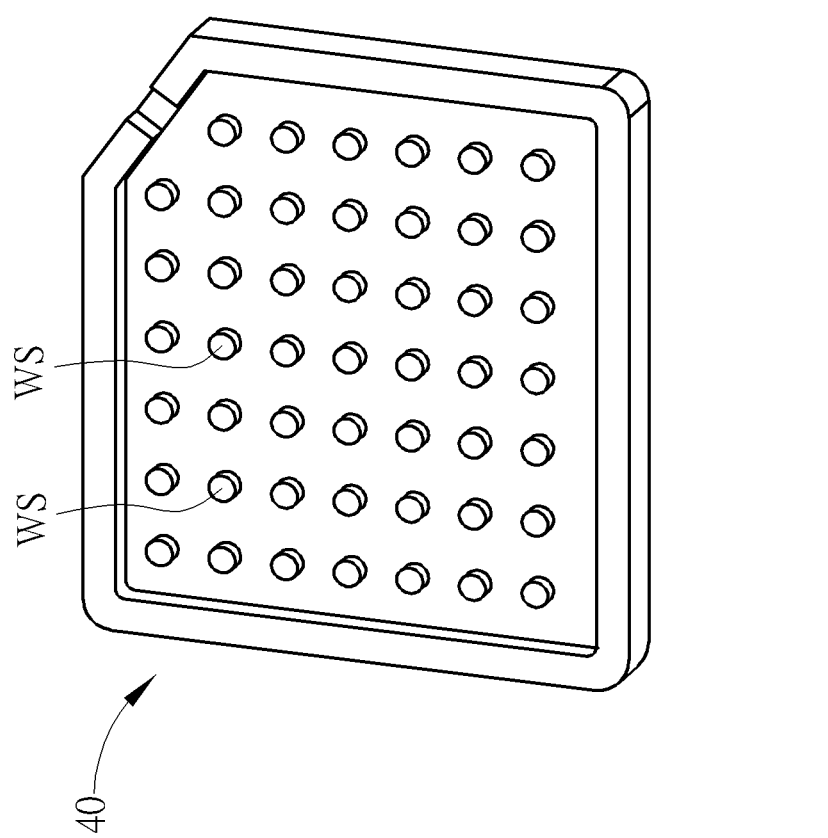
FIG. 2 is a perspective view showing the pillar-shaped wick structures within the vapor chamber lid according to one embodiment.

According to an exemplary embodiment, as shown in FIG. 2, the wick structures WS may comprise pillar-shaped wicks and may comprises differing distribution density across the vacuum-sealed cavity SC. For example, the wick structures WS may have a lower density in a region directly over the semiconductor device 10 and a higher density in a region far away from the semiconductor device 10.

According to an exemplary embodiment, for example, the wick structures WS may comprise porous copper wicks. According to an exemplary embodiment, the wick structures WS may comprise porous wick structures that generate a capillary pressure to recirculate the working fluid F between an evaporator side ES and a condenser side CS of the vapor chamber lid 40. According to an exemplary embodiment, optionally, a heat sink 50 may be mounted on the vapor chamber lid 40 and in thermal contact with the condenser side CS of the vapor chamber lid 40.

The thermal resistance to lateral flow of heat flux through the lid 40 of the semiconductor package 1 may be reduced by incorporating vapor chamber into the lid itself. This has the further benefit of reducing the effective thermal resistance of the mechanical interface between the lid of the package and the external heat sink 50. The vapor chamber makes the lid a better thermal path from the semiconductor device 10 to the heat sink 50.

Figure 3:
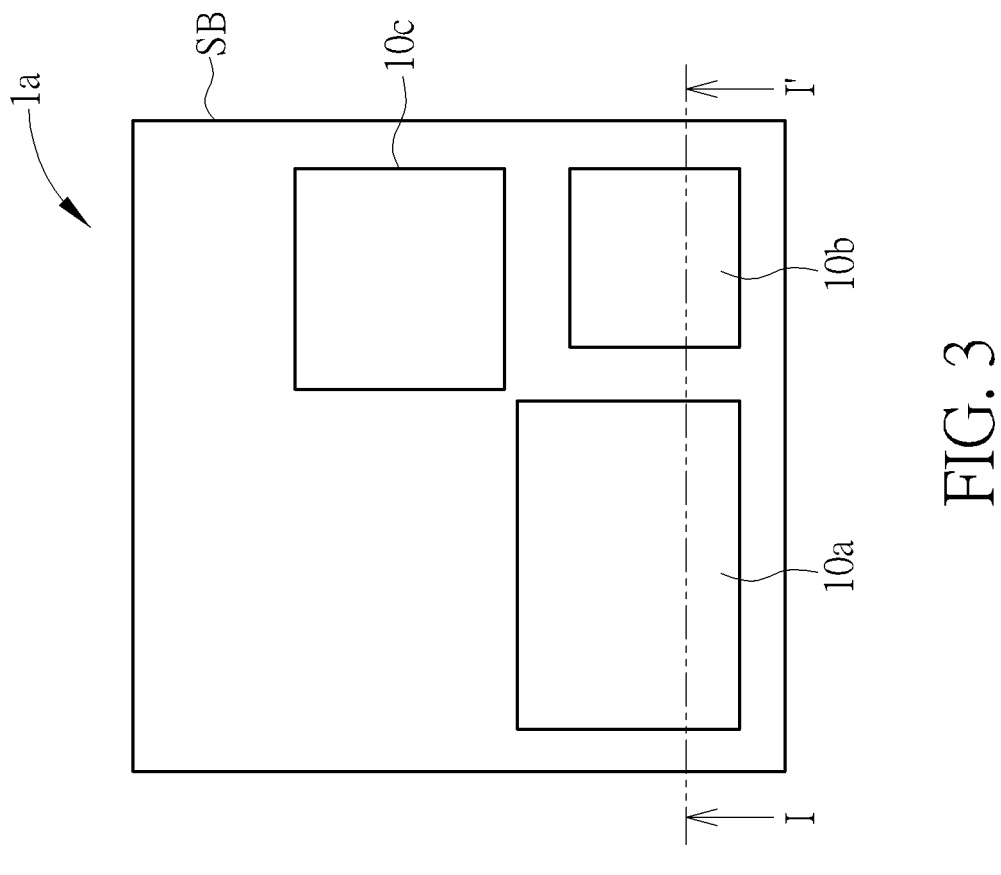
FIG. 3 is a schematic layout diagram showing a multi-die semiconductor package with a vapor chamber lid according to another embodiment.
Figure 4:
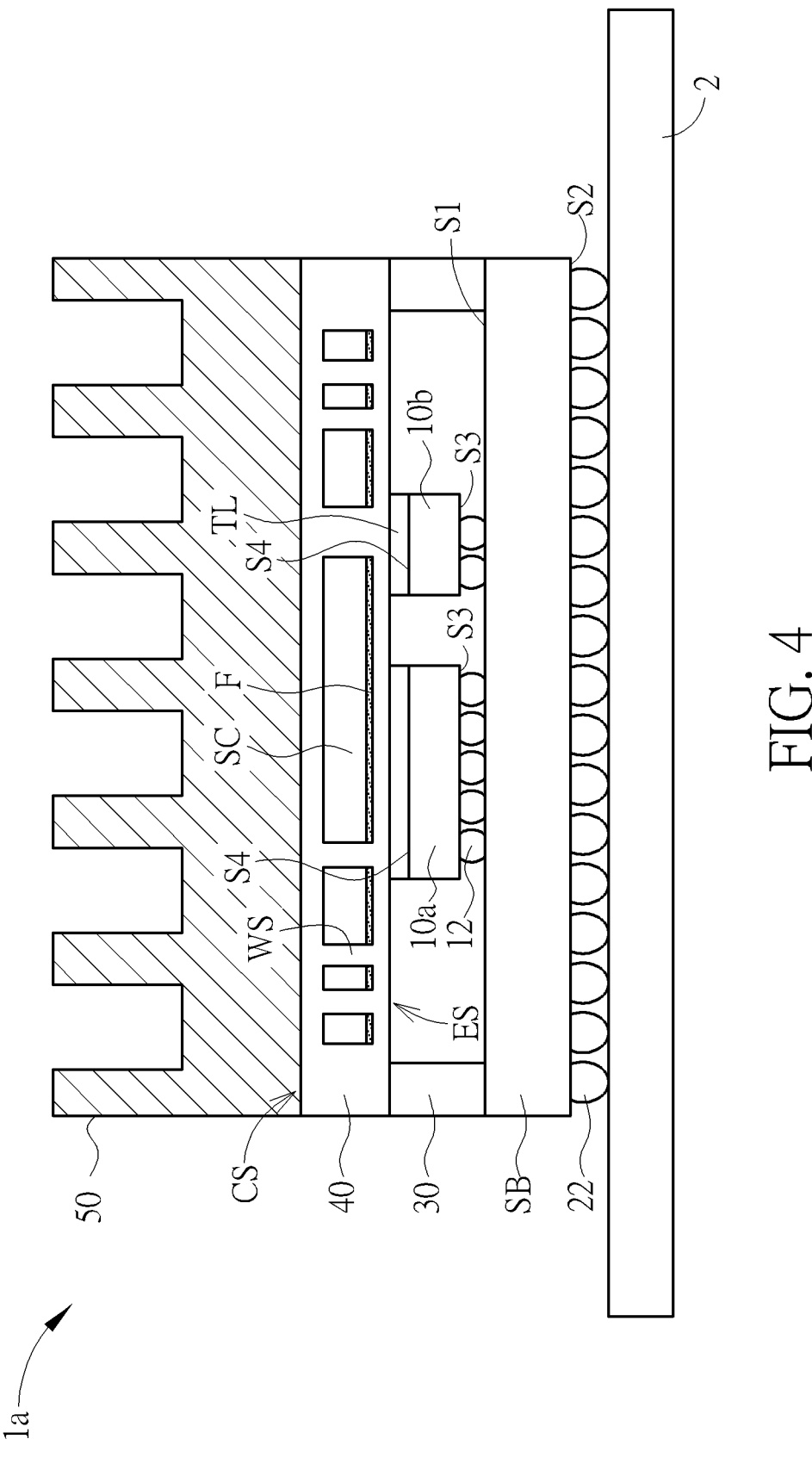
FIG. 4 is a schematic, cross-sectional diagram of the multi-die semiconductor package taken along line I-I' of FIG. 3.

Please refer to FIG. 3 and FIG. 4. FIG. 3 is a schematic layout diagram showing a multi-die semiconductor package 1a with a vapor chamber lid 40 according to another embodiment. FIG. 4 is a schematic, cross-sectional diagram of the multi-die semiconductor package taken along line I-I' of FIG. 3, wherein like layers, regions or elements are designated by like numeral numbers or labels.

As shown in FIG. 3 and FIG. 4, likewise, the semiconductor package 1a comprises a substrate SB such as a package substrate having a top surface S1 and a bottom surface S2. At least three semiconductor devices 10a, 10b and 10c are mounted on the top surface S1 of the substrate SB in a flip-chip manner. Each of the semiconductor devices 10a-10c has an active front surface S3 directly facing the substrate SB, and an opposite rear surface S4. According to an exemplary embodiment, the semiconductor devices 10a-10c may comprise a semiconductor die or a semiconductor package, but is not limited thereto.

According to an exemplary embodiment, the semiconductor devices 10a-10c may be adjoined to the top surface S1 of the substrate SB using a plurality of connecting elements 12, for example, solder bumps, metal bumps, metal pillars, or micro-bumps. According to an exemplary embodiment, the semiconductor package 1a may be mounted onto a printed circuit board (PCB) 2 through a plurality of solder balls or BGA balls 22 distributed on the bottom surface S2 of the substrate SB.

According to an exemplary embodiment, a stiffener ring 30 is mounted on the top surface S1 of the substrate SB. The stiffener ring 30 surrounds the semiconductor devices 10a-10c. According to an exemplary embodiment, the stiffener ring 30 may be secured to the top surface S1 of the substrate SB by using an adhesive layer (not shown), but is not limited thereto. The stiffener ring 30 may be disposed along the perimeter of the substrate SB so as to form a rectangular shape when viewed from the above, for example. The stiffener ring 30 may be composed of copper, but is not limited thereto.

According to an exemplary embodiment, a vapor chamber lid 40 is adhered to the stiffener ring 30 by using, for example, an adhesive layer (not shown), but is not limited thereto. According to an exemplary embodiment, the vapor chamber lid 40 is in thermal contact with the rear surface S4 of each of the semiconductor devices 10a-10c. According to an exemplary embodiment, for example, a layer of thermal interface material or thermal conductive glue TL may be disposed between the vapor chamber lid 40 and the rear surface S4 of each of the semiconductor devices 10a-10c.

According to an exemplary embodiment, the vapor chamber lid 40 comprises an internal vacuum-sealed cavity SC that stores a working fluid F, and wick structures WS for recirculating the working fluid F within the internal vacuum-sealed cavity SC. According to an exemplary embodiment, for example, the vapor chamber lid 40 may be formed of copper or aluminum, but is not limited thereto. According to an exemplary embodiment, for example, the working fluid F may comprise water or deionized water under partial vacuum.

According to an exemplary embodiment, the wick structures WS may comprise pillar-shaped wicks and may comprises differing distribution density across the vacuum-sealed cavity SC to adapt to a power map of the semiconductor devices 10a-10c. For example, the wick structures WS may have a lower density in a region directly over the semiconductor devices 10a-10c and a higher density in a region far away from the semiconductor devices 10a-10c.

In some exemplary embodiments, the wick structures may be formed by weaving metal wires having a large amount of pores. In some exemplary embodiments, the wick structures may be formed by sintering of copper powder. Copper is often chosen as the wick material since it has a high thermal conductivity enabling to transfer high heat fluxes from the evaporator wall to the working fluid.

According to an exemplary embodiment, for example, the wick structures WS may comprise porous metallic wicks, such as porous copper wicks. According to an exemplary embodiment, the wick structures WS may comprise porous wick structures that generate a capillary pressure to recirculate the working fluid F between an evaporator side ES and a condenser side CS of the vapor chamber lid 40. According to an exemplary embodiment, optionally, a heat sink 50 may be mounted on the vapor chamber lid 40 and in thermal contact with the condenser side CS of the vapor chamber lid 40.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a substrate having a top surface and a bottom surface;
a plurality of semiconductor devices mounted on the top surface of the substrate, wherein each of the plurality of semiconductor devices has an active front surface directly facing the substrate, and an opposite rear surface;
a vapor chamber lid in thermal contact with a rear surface of each of the plurality of semiconductor devices, wherein the vapor chamber lid comprises an internal vacuum-sealed cavity that stores a working fluid, and wick structures for recirculating the working fluid within the internal vacuum-sealed cavity, wherein the wick structures have a differing distribution density across the internal vacuum-sealed cavity to adapt to a power map of the plurality of semiconductor devices; and
a stiffener ring mounted on the top surface of the substrate, wherein the stiffener ring surrounds the semiconductor device, wherein the wick structures comprises differing distribution density across the vacuum-sealed cavity to adapt to a power map of the plurality of semiconductor devices, and wherein the wick structures has a lower density in a region directly over each of the plurality of semiconductor devices and a higher density in a region between the plurality of semiconductor devices.

2. The semiconductor package according to claim 1, wherein the wick structures are porous wick structures that generate a capillary pressure to recirculate the working fluid between an evaporator side and a condenser side of the vapor chamber lid.

3. The semiconductor package according to claim 1, wherein the vapor chamber lid is adhered to the stiffener ring.

4. The semiconductor package according to claim 2 further comprising:

a heat sink mounted on the vapor chamber lid and in thermal contact with the condenser side of the vapor chamber lid.

5. The semiconductor package according to claim 1, wherein the vapor chamber lid comprises copper or aluminum.

6. The semiconductor package according to claim 1, wherein the working fluid comprises water.

7. The semiconductor package according to claim 1, wherein the wick structures comprise porous copper wicks.

8. The semiconductor package according to claim 1, wherein the semiconductor device is adjoined to the top surface of the substrate using a plurality of connecting elements.

\* \* \* \* \*